United States Patent [19]
Sakamoto

[11] Patent Number: 5,907,390
[45] Date of Patent: May 25, 1999

[54] POSITIONING APPARATUS, EXPOSURE APPARATUS AND METHOD OF MANUFACTURING SEMICONDUCTOR DEVICE

[75] Inventor: Eiji Sakamoto, Utsunomiya, Japan

[73] Assignee: Canon Kabushiki Kaisha, Tokyo, Japan

[21] Appl. No.: 08/941,208

[22] Filed: Sep. 30, 1997

[30] Foreign Application Priority Data

Oct. 4, 1996 [JP] Japan .................. 8-281596

[51] Int. Cl.⁶ .................................................. G03B 27/52
[52] U.S. Cl. ........................ 355/30; 355/53; 356/400; 250/443.1
[58] Field of Search ................ 355/30, 53, 72; 356/399, 400, 401; 359/507, 509, 512; 250/443.1, 442.11

[56] References Cited

U.S. PATENT DOCUMENTS

| | | | |
|---|---|---|---|
| 4,786,947 | 11/1988 | Kosugi et al. | 355/30 |
| 4,814,625 | 3/1989 | Yabu | 356/401 |
| 4,969,168 | 11/1990 | Sakamoto et al. | 378/34 |
| 5,063,582 | 11/1991 | Mori et al. | 378250/34 |
| 5,093,579 | 3/1992 | Amemiya et al. | 250/453.1 |
| 5,138,643 | 8/1992 | Sakamoto et al. | 378/34 |
| 5,141,318 | 8/1992 | Miyazaki et al. | 356/358 |
| 5,194,893 | 3/1993 | Nishi . | |
| 5,220,171 | 6/1993 | Hara et al. | 250/443.1 |
| 5,231,291 | 7/1993 | Amemiya et al. | 250/443.1 |
| 5,281,996 | 1/1994 | Bruning et al. . | |
| 5,469,260 | 11/1995 | Takagi et al. | 356/400 |

FOREIGN PATENT DOCUMENTS 3-129720  6/1991  Japan .

*Primary Examiner*—Alan A. Mathews
*Attorney, Agent, or Firm*—Fitzpatrick, Cella, Harper & Scinto

[57] ABSTRACT

Positioning accuracy of a scanning stage is improved as a result of reducing error by reducing a non-uniformity in the temperature of air on an optical path of length measurement of the stage. An apparatus for measuring the position of a reticle stage and adjusting the position of the stage based upon the results of measurement includes a reflecting mirror secured to the stage, an interferometer for measuring the distance between a reference position and the reflecting mirror using light, and an air conditioner for supplying a temperature-regulated air stream to an optical path of length measurement connecting the reference position and the reflecting mirror, the air stream being supplied at a speed higher than the speed at which the stage is scanned.

20 Claims, 7 Drawing Sheets

A > B

POSITIONING APPARATUS, EXPOSURE APPARATUS AND METHOD OF MANUFACTURING SEMICONDUCTOR DEVICE

BACKGROUND OF THE INVENTION

This invention relates to a positioning apparatus, an exposure apparatus and a method of manufacturing a semiconductor device. More particularly, the invention relates to a positioning apparatus for measuring the position of a stage very accurately using light, and adjusting the position of the stage highly precisely based upon the results of measurement, an exposure apparatus having this positioning apparatus, and a method of manufacturing a semiconductor device using these apparatus.

The higher degree of integration applied to semiconductor integrated circuits has been accompanied by greater demand for the formation of ultrafine patterns, and this has led to demand for greater positioning accuracy of reticles and wafers. For this reason, it is required that a scanning-type exposure apparatus have a high positioning accuracy of 0.01 µm or less for a reticle stage which supports a reticle or for a wafer stage on which a wafer is placed for scanning the wafer relative to a projection optical system. A laser interferometer is used to achieve this highly precise measurement.

In measurement of length performed by an interferometer, a fluctuation in the refractive index of air on the optical path of length measurement is a cause of error. The refractive index of air varies depending upon temperature, and the rate of this change is about 1 ppm/°C. Accordingly, in order to make the measurement error less than 0.01 µm when the measured distance is 300 mm, it is required that the variation in the temperature of air be held below 0.03° C.

To achieve this, an XY positioning apparatus for positioning a wafer in the X and Y directions in a step-and-repeat reduced-projection exposure apparatus (stepper) is equipped with an air conditioner. A variation in the temperature of the air on the optical path of length measurement is reduced by air conditioner down-flow from above (the Z direction) or air conditioner side-flow from the side (the X or Y direction).

The down-flow scheme is ideal. However, in a semiconductor exposure apparatus or reticle coordinate measurement apparatus, a projection lens, microscope, focus sensor and other devices are disposed in close proximity to the top table of the XY positioning apparatus. As a result, the down-flow scheme is difficult to realize owing to design limitations. Consequently, the side-flow method is widely employed.

Such an XY positioning apparatus, however, includes a source of heat such as a motor for drive in the X and Y directions. As a consequence, the temperature of the positioning apparatus becomes higher than the temperature of the air flow from the air conditioner. It is known that this causes the air flow to develop an uneven temperature distribution (see the specification of Japanese Patent Application Laid-Open No. 3-129720, and Ishida: O plus E, 1995, October, pp. 84~89). If the temperature of the air flow becomes non-uniform, an error in measurement of length occurs. The same problem arises in a scanning-type exposure apparatus.

SUMMARY OF THE INVENTION

Accordingly, an object of the present invention is to improve positioning accuracy by reducing a non-uniformity in the temperature of air on the optical path of length measurement so as to reduce measurement error.

According to the present invention, the foregoing object is attained by providing a positioning apparatus for measuring position of a stage and adjusting the position of the stage based upon the results of measurement, comprising: a reflecting mirror secured to the stage; measuring means for measuring distance between a reference position and the reflecting mirror using light; and supply means for supplying temperature-regulated air streams to an optical path of length measurement connecting the reference position and the reflecting mirror, the air streams being supplied at a speed higher than a speed at which the stage is scanned.

Further, according to the present invention, there is provided an exposure apparatus having reticle positioning means which includes a stage on which a reticle is placed, and substrate positioning means which includes a stage on which a substrate is placed, the substrate being exposed to a pattern on the reticle while the positional relationship between the reticle and the substrate is adjusted, and least one of the reticle positioning means or the substrate positioning means comprising: a reflecting mirror secured to the stage; measuring means for measuring distance between a reference position and the reflecting mirror using light; and supply means for supplying temperature-regulated air streams to an optical path of length measurement connecting the reference position and the reflecting mirror, the air streams being supplied at a speed higher than a speed at which the stage is scanned.

Further object, features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Figure 1:
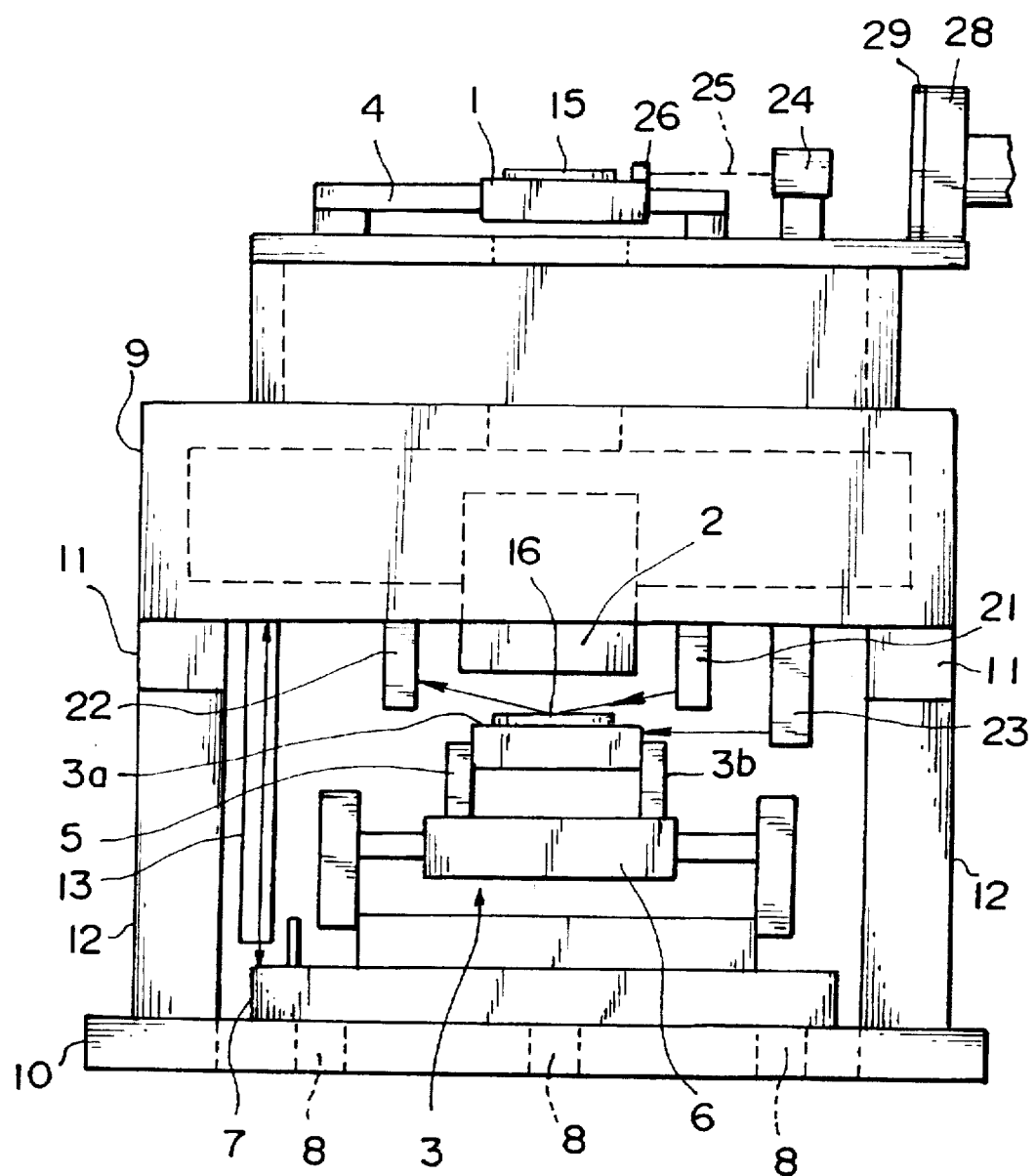
FIG. 1 is a schematic view, seen from the side, of a scanning-type exposure apparatus according to a preferred embodiment of the present invention.
Figure 1:
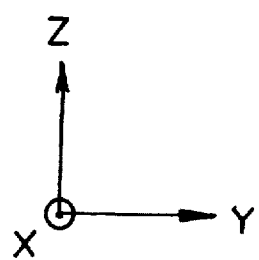
Figure 2:
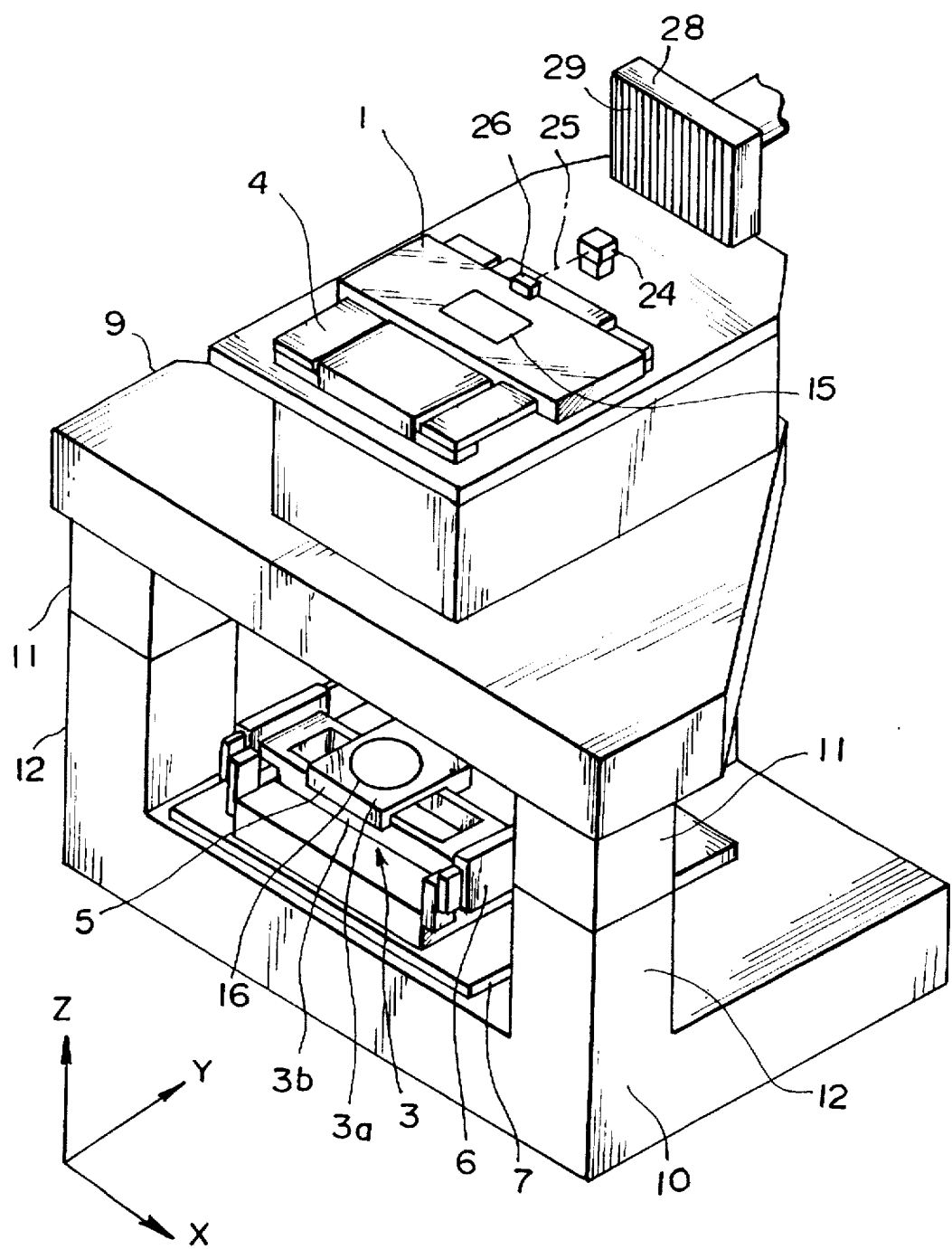
FIG. 2 is a perspective view illustrating the external appearance of the scanning-type exposure apparatus according to the preferred embodiment.
Figure 3:
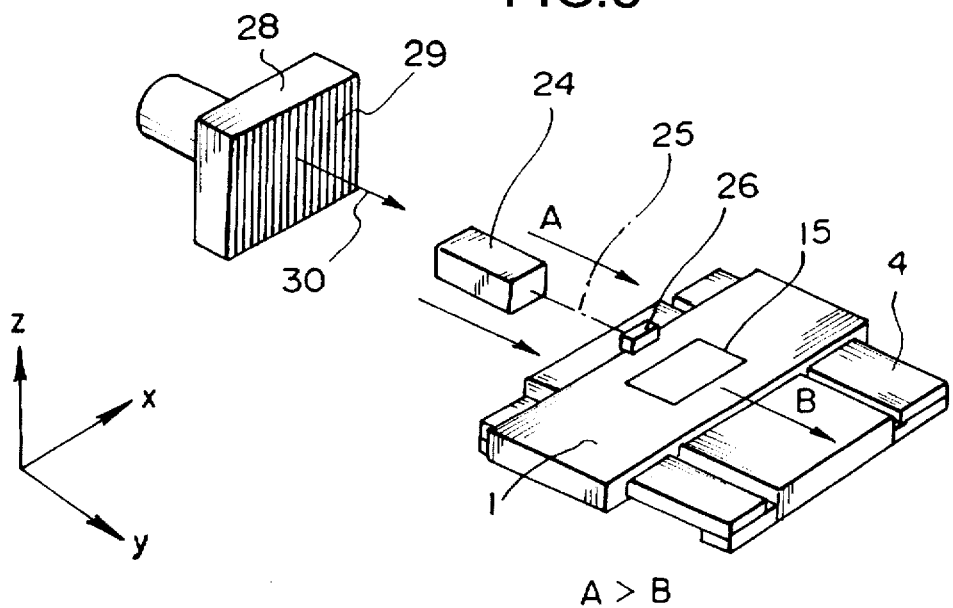
FIG. 3 is a perspective view useful in describing components peripheral to a reticle stage shown in FIGS. 1 and 2.

Preferred embodiments of the present invention will now be described with reference to the drawings. FIG. 1 is a schematic view, seen from the side, of a scanning-type exposure apparatus according to a preferred embodiment of the present invention. FIG. 2 is a perspective view illustrating the external appearance of the exposure apparatus according to the preferred embodiment, and FIG. 3 is a view showing components peripheral to a reticle stage of this exposure apparatus.

This exposure apparatus projects part of the pattern of a reticle 15 on a reticle stage 1 onto a wafer 16 on an XY stage 3 via a projecting optical system 2, and scans the reticle 15 and wafer 16 synchronously in the Y direction with respect to the projecting optical system 2 to thereby expose the wafer 16 to the pattern of the reticle 15. This exposure apparatus, which is of the so-called step-and-scan type, executes the scanning exposure of each exposure area (shot) on the wafer 16 while moving the XY stage 3 in stepwise fashion.

According to this apparatus, the reticle stage 1 is driven in the Y direction by a linear motor 4. The wafer stage 3 has an X stage 3a driven in the X direction by a linear motor 5 and a Y stage 3b driven in the Y direction by a linear motor 6. Synchronous scanning of the reticle 15 and wafer 16 is carried out by driving the reticle stage 1 and Y stage 3b in the Y direction at a fixed velocity ratio (e.g. 4:−1, where the minus sign indicates the opposite direction) while observing the positions of the reticle stage 1 and Y stage 3b using laser interferometers 24, 23, respectively. Stepping in the X direction is performed by the X stage 3a.

The wafer stage 3 is provided on a stage table 7, which is supported on a floor or the like at three points via three dampers 8. The reticle stage 1 and projecting optical system 2 are provided on a lens barrel table 9, which is supported on a base frame 10 placed on the floor, via three dampers 11 and three struts 12. Here each damper 8 is an active damper which actively suppresses or eliminates vibration along six axes. However, a passive damper may be used or the stage table 7 may be supported without the intervention of dampers in other examples of arrangements.

Further, the exposure apparatus is equipped with a distance measuring unit 13 such as a laser interferometer or microencoder for measuring the distance between the lens barrel table 9 and the stage table 7 at three points.

A projecting unit 21 and a light-receiving unit 22 construct a focus sensor for sensing whether the wafer 16 on the wafer stage 3 is situated on the focal plane of the projecting optical system 2. That is, the wafer 16 is obliquely irradiated with light by the projecting unit 21, which is secured to the lens barrel table 9, and the position of the reflected light from the wafer is sensed by the light-receiving unit 22, whereby the position of the wafer surface along the direction of the optic axis of the projecting optical system 2 is sensed.

In the arrangement set forth above, a wafer is transported onto the wafer stage 3 along the conveyance path between the two struts 12 at the front of the apparatus by a conveyance device, which is not shown. When the prescribed positioning is completed, the exposure apparatus exposes a plurality of exposure areas on the wafer 16 to the pattern on the reticle 15 to effect transfer of the pattern to the wafer 16 while repeating scanning exposure and stepping movement.

In scanning exposure, the reticle stage 1 and Y stage 3b are moved at a predetermined velocity ratio along the Y direction (scanning direction) to scan the pattern on the reticle 15 by the slit-shaped exposing light and scan the wafer 16 by the projected image, whereby a prescribed area on the wafer 16 is exposed to the pattern on the reticle 15.

During scanning exposure, the height of the wafer surface is measured by the focus sensor and both the height and tilt of the wafer stage 3 are controlled in real time based upon the measured value, whereby a focus correction is carried out. When the scanning exposure of one exposure area is finished, the X stage 3a is driven along the X direction to step the wafer and position another exposure area at the scanning exposure starting position, whereupon scanning exposure is carried out again. It should be noted that the disposition of each exposure area, the scanning direction (in either the positive of negative Y direction) and the sequence through which the exposure areas are exposed have been set in such a manner that the plurality of exposure areas on the wafer can be successively exposed in an efficient manner by the combination of the stepping movement in the X direction and movement for scanning exposure in the Y direction.

In the apparatus of FIG. 1, light emitted by a light source (not shown) is introduced to the laser interferometer 24 for the Y direction. The light that has been introduced to the laser interferometer 24 is split by a beam splitter (not shown) within the laser interferometer 24 into light directed toward a stationary mirror (not shown) within the laser interferometer 24 and light directed toward a mirror 26 movable in the Y direction. The light directed toward the mirror 26 movable in the Y direction impinges upon the mirror 26, which is secured to the reticle stage 4, via an optical path 25 of length measurement in the Y direction. The light reflected by the mirror 26 returns to the beam splitter in the laser interferometer 24 via the optical path 25 of length measurement in the Y direction so that this light is superposed upon the light reflected by the stationary mirror. By sensing a change in the interference of the light at this time, the traveling distance along the Y direction, namely the distance between the laser interferometer 24 (reference position) and moving mirror 26, can be measured. The information representing the traveling distance thus measured is fed back to a scanning controller (not shown) so that positioning control of the scanning position of reticle stage 1 is carried out.

FIG. 3 is a diagram useful in describing, in greater detail, components peripheral to a reticle stage in the apparatus of FIG. 1. Shown in FIG. 3 are the reticle stage 1, which is capable of being scanned in the Y direction while holding the reticle 15, the linear motor 4 for driving the reticle stage 1, the Y-direction laser interferometer 24 for measuring the position of the reticle stage 1 in the Y direction, the optical path 25 of length measurement in the Y direction, the Y-direction movable mirror 26 secured to the reticle stage 1, an air conditioner 28 for blowing an air stream, which has been regulated to a fixed temperature, in the scanning direction of the reticle stage 1, a filter 29, which is provided at the outlet of the air conditioner 28, for cleaning the air from the air conditioner 28, and an air stream 30 blown from the air conditioner 28. An example of the filter 29 which can be used is a HEPA (manufactured by Nihon Cambridge Filter K.K.).

The flow of the air stream and its temperature were simulated. The flow rate (wind speed) A of the air stream 30 blown from the air conditioner 28 along the optical path of length measurement was 0.05 m/s and the scanning speed B of the reticle stage 4 was 0.1 m/s. Turbulence and stagnation were produced in back of the reticle stage 1, air heated by the linear motor 27 flowed in and it was confirmed that the temperature of the air on the length-measurement optical path 25 of the laser fluctuated by about 0.3° C. On the other hand, in a case where the wind speed A of the air stream 30 was made 0.2 m/s, which is higher than the scanning speed B (=0.1 m/s) of the stage 4, according to this embodiment, the air in the vicinity of the linear motor 27 was impelled in its entirety toward the front of the reticle stage 1 in the scanning direction (Y direction) and the air on the length-measurement optical path 25 of the laser consisted solely of air blown from the air conditioner 28. It was found that the temperature fluctuation in this case was less than 0.1° C.

Figure 4:
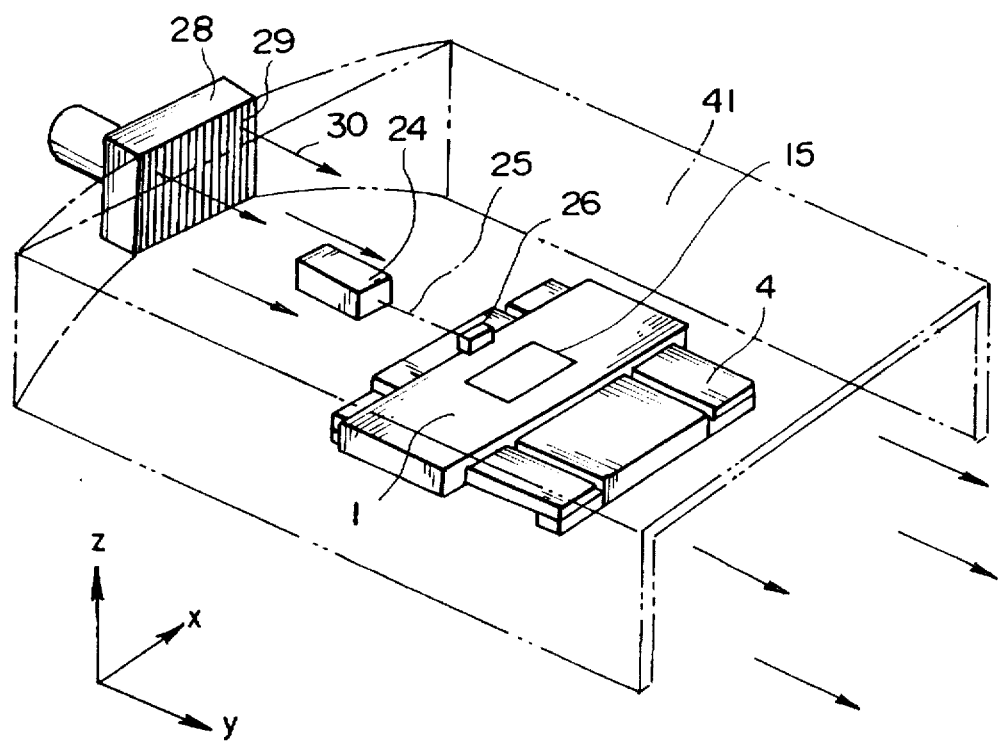
FIG. 4 is a perspective view showing the construction of a reticle stage (scanning stage) according to another embodiment of the present invention.

FIG. 4 illustrates the construction of the reticle stage according to another embodiment. Here the reticle stage is so adapted that the results of the above-mentioned simulation are reproduced to a greater degree. This embodiment includes an air duct 41 connected to the blower outlet of the air conditioner 28. The reticle stage 1 is installed within the air duct 41. The air duct 41 preferably has such a shape that the cross section of the duct changes continuously and smoothly. In addition, it is preferred that the air duct 41 be so designed that the direction of the air stream 30 expelled from the air conditioner 28 substantially lie along the scanning direction on the optical path of length measurement. Such an arrangement makes it possible to efficiently reduce the variation in the temperature of the air along the optical path 25 of length measurement in the Y direction.

Figure 5:
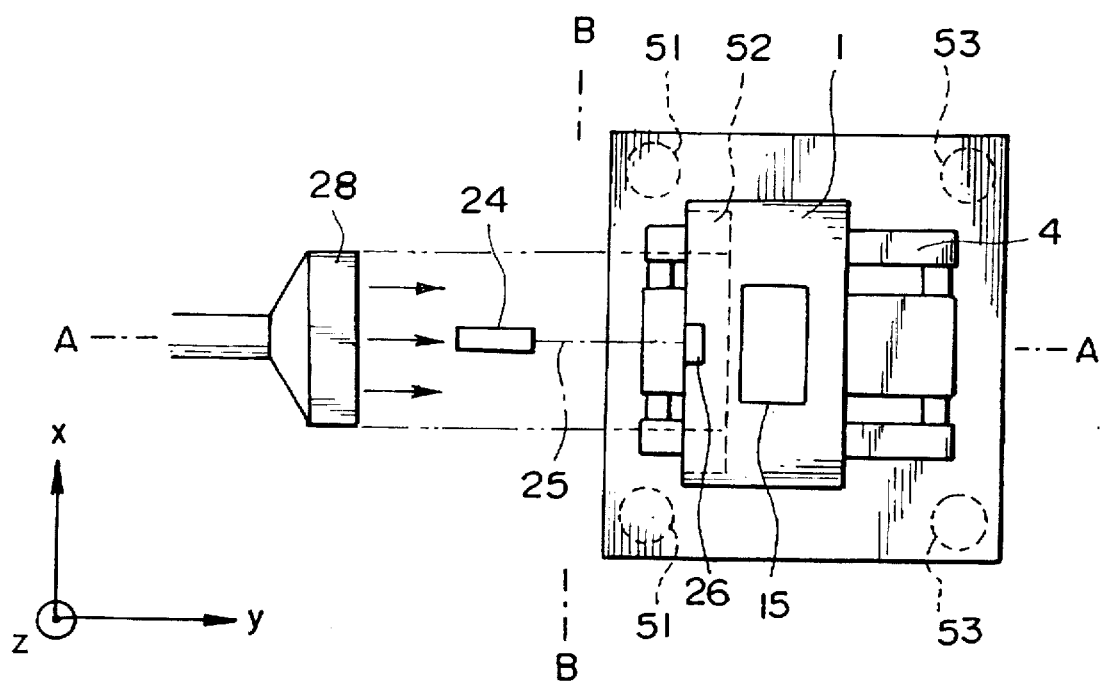
FIG. 5 is a perspective view showing the construction of a reticle stage (scanning stage) according to yet another embodiment of the present invention.
Figure 6:
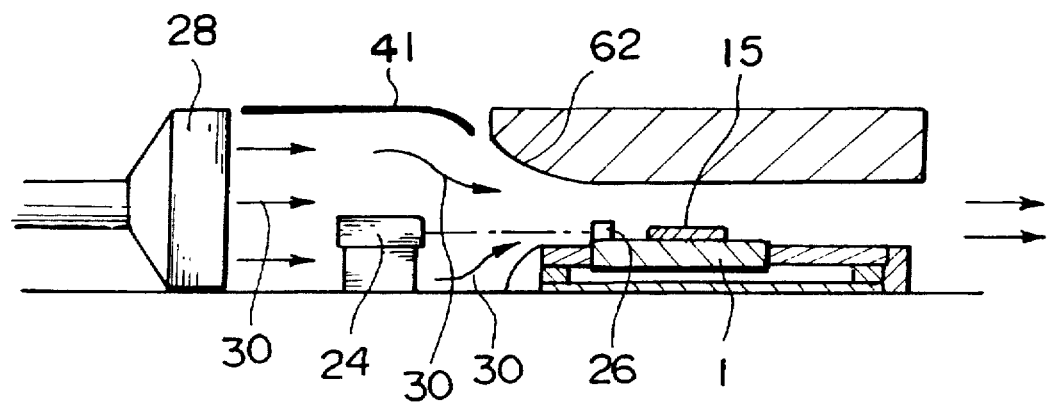
FIG. 6 is a sectional view taken along line A-A' of FIG. 5.
Figure 7:
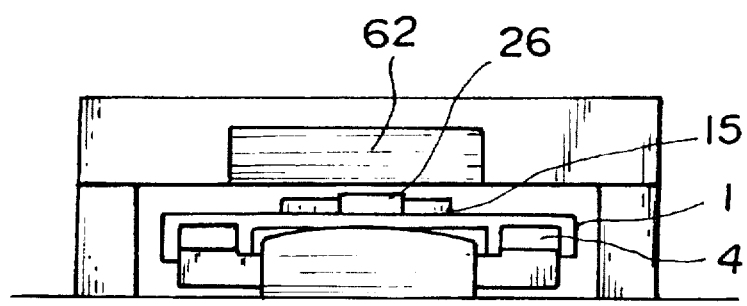
FIG. 7 is a diagram illustrating the reticle stage (scanning stage) of FIG. 5 as seen from line B-B'.

FIG. 5 is a view showing the construction of the reticle stage according to yet another embodiment of the present invention. FIG. 6 is a sectional view taken along line A-A' of FIG. 5, and FIG. 7 is a diagram illustrating the reticle stage as seen from line B-B' in FIG. 5.

Disposed above the reticle stage 1 are such structures as, say, a reticle alignment scope 51, a TTL off-axis scope 52 for wafer alignment, and a TTR scope 53. In this case a cover 61 preferably is provided between the air conditioner 28 and the optical path 25 of length measurement. It is preferred that the shapes of structures situated in the air duct be designed in such a manner that the air duct will have a smooth, continuous cross section. For example, the corner portion of the structure above the reticle stage desirably is removed as indicated at 62 in FIG. 6.

In each of the embodiments set forth above, the present invention is applied to the reticle stage 1. However, the invention is applicable similarly to the wafer stage 3 and to other scanning stages as well.

[Embodiment of Microdevice Manufacture]

Figure 8:
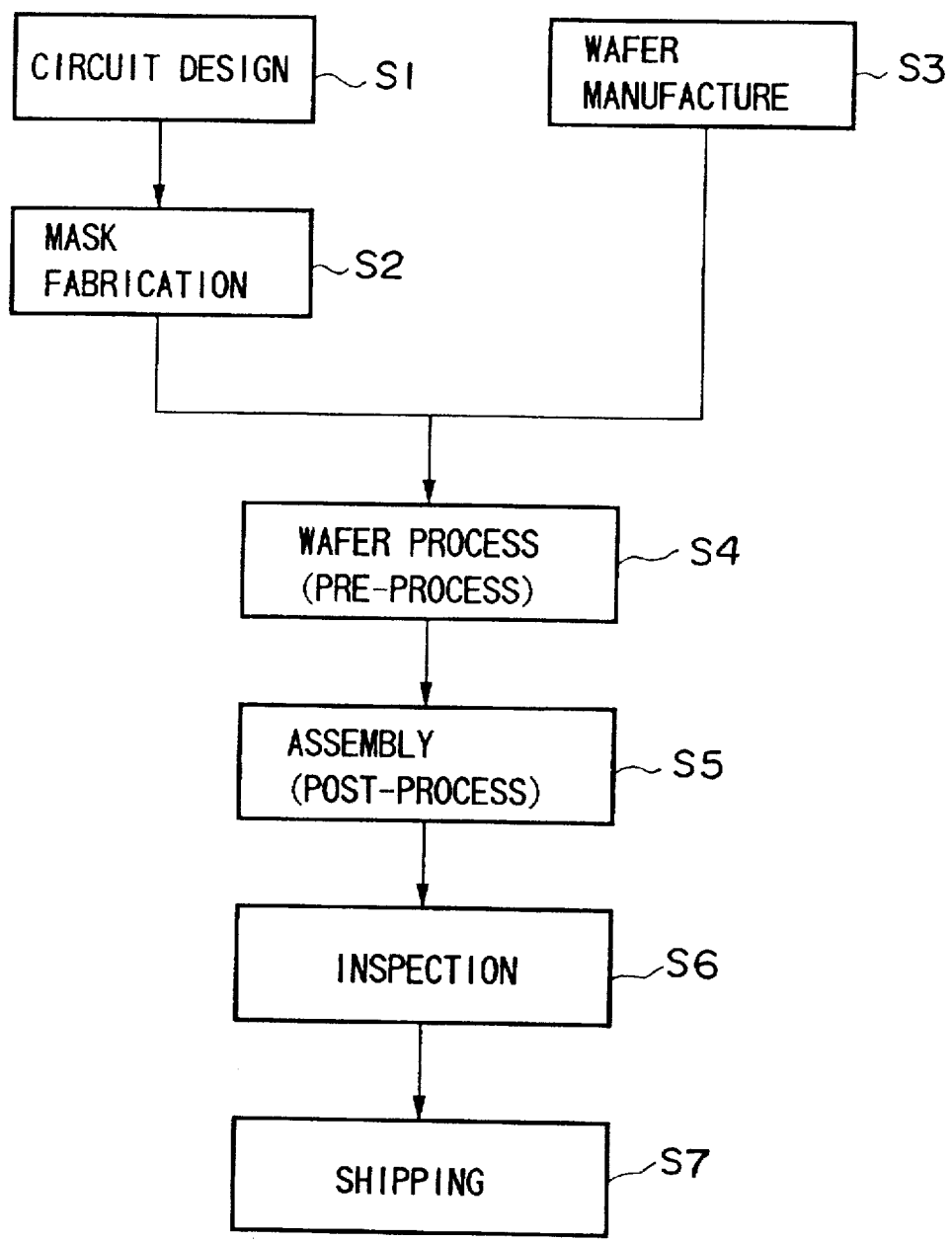
FIG. 8 is a diagram showing the flow of manufacture of a microdevice.

FIG. 8 illustrates the flow of manufacture of a microdevice (a semiconductor chip such as an IC or LSI chip, a liquid crystal panel, a CCD, a thin-film magnetic head, a micromachine, etc.). The circuitry of the semiconductor device is designed at step 1 (circuit design). A mask on which the designed circuit pattern is formed is fabricated at step 2 (mask fabrication). Meanwhile, a wafer is manufactured using a material such as silicon at step 3 (wafer manufacture). The actual circuit is formed on the wafer by lithography, using the mask and wafer that have been prepared, at step 4 (wafer process), which is also referred to as a "pre-process". A semiconductor chip is obtained, using the wafer fabricated at step 4, at step 5 (assembly), which is also referred to as a "post-process". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7).

Figure 9:
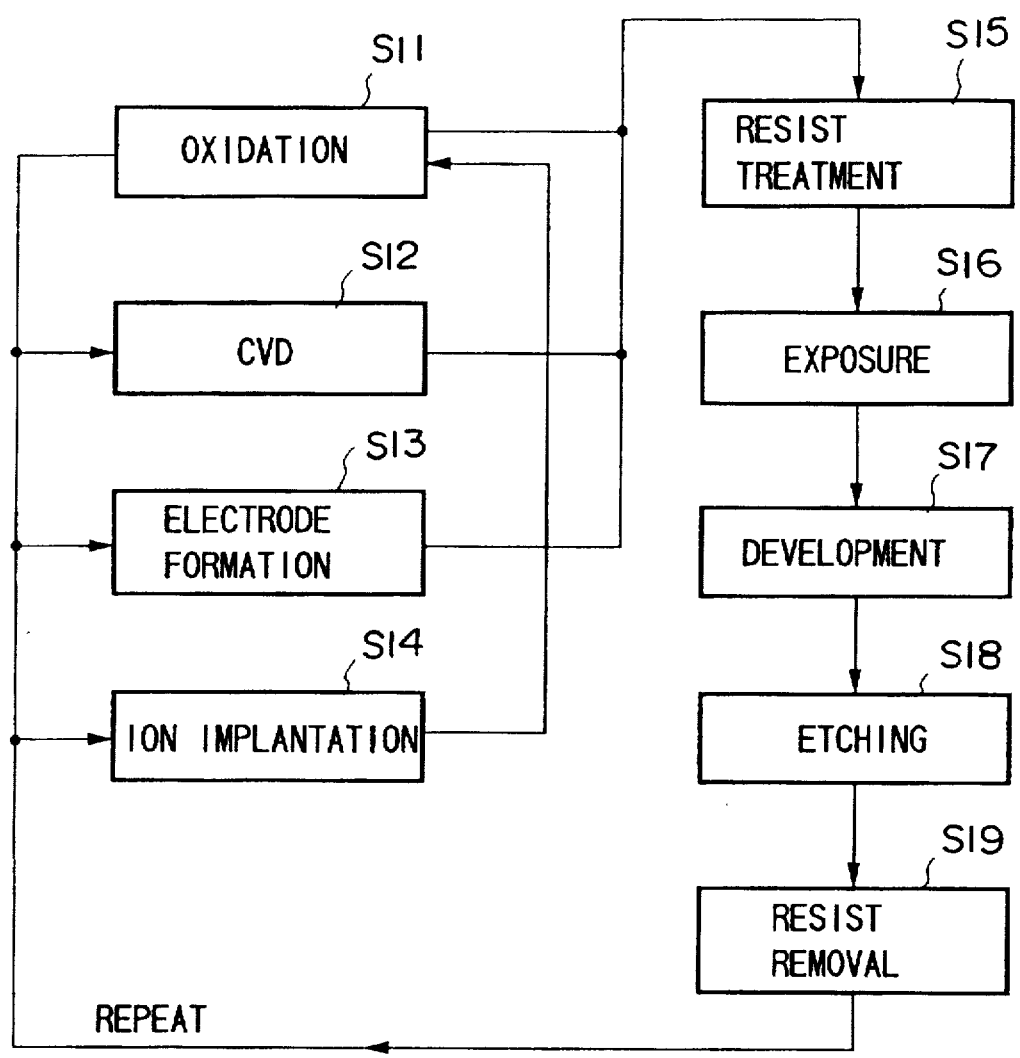
FIG. 9 is a diagram illustrating the detail flow of a wafer process in FIG. 8.

FIG. 9 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

Applying the above-described positioning apparatus or exposure apparatus in the semiconductor device manufacturing process set forth above makes it possible to easily manufacture a semiconductor device having a high degree of integration.

In accordance with the preferred embodiments of the present invention, as described above, wind speed on the optical path of length measurement is made higher than the traveling speed of the scanning stage when an air stream regulated to a fixed temperature is supplied along this optical path. As a result, it is possible to prevent air heated by a heat source such as a linear motor from influencing the optical path of length measurement, thereby making it possible to prevent a variation in temperature on this optical path. Measurement error can be reduced and positioning accuracy improved regardless of the position of the scanning stage.

The present invention is not limited to the above embodiments and various changes and modifications can be made within the spirit and scope of the present invention. Therefore, to apprise the public of the scope of the present invention, the following claims are made.

What is claimed is:

1. A positioning apparatus for measuring a position of a stage movable at a constant speed and adjusting the movement of the stage based upon results of measurement, comprising:

a reflecting mirror secured to the stage;

measuring means for measuring distance between a reference position and said reflecting mirror using light; and supply means for supplying temperature-regulated air streams to an optical path of length measurement connecting the reference position and said reflecting mirror, the air streams being supplied at a speed higher than the constant speed at which the stage is moved.

2. The apparatus according to claim 1, wherein said supply means produces air streams having a direction substantially parallel to the optical path of length measurement.

3. The apparatus according to claim 1, wherein said supply means supplies the optical path of length measurement with air streams having a speed higher than the speed when the stage is moved in a direction away from said supply means.

4. The apparatus according to claim 1, wherein said supply means includes an air duct that surrounds the stage.

5. The apparatus according to claim 4, wherein said air duct has a smoothly and continuously changing cross sectional area.

6. The apparatus according to claim 4, wherein said air duct has such a shape that directions of the air streams are made substantially the same.

7. The apparatus according to claim 1, wherein said supply means produces air streams having a direction substantially parallel to a direction in which heat sources are arrayed.

8. The apparatus according to claim 7, wherein the direction in which the heat sources are arrayed is substantially parallel to the optical path of length measurement.

9. The apparatus according to claim 7, wherein the heat sources are linear motors for driving the stage.

10. A method of manufacturing a semiconductor device while adjusting, by the positioning apparatus described in claim 1, position of a stage on which a reticle and/or substrate has been placed.

11. A scanning-type exposure apparatus having reticle positioning means which includes a stage on which a reticle is placed, and substrate positioning means which includes a stage on which a substrate is placed, the substrate being exposed to a pattern on the reticle while the reticle and the substrate are scanned, and at least one of the reticle positioning means and the substrate positioning means comprising:

a reflecting mirror secured to the stage;

measuring means for measuring distance between a reference position and said reflecting mirror using light; and supply means for supplying temperature-regulated air streams to an optical path of length measurement connecting the reference position and said reflecting mirror, the air streams being supplied at a speed higher than a speed at which the stage is scanned during scanning exposure.

12. The apparatus according to claim 11, wherein said supply means produces air streams having a direction substantially parallel to the optical path of length measurement.

13. The apparatus according to claim 11, wherein said supply means supplies the optical path of length measurement with air streams having a speed higher than the scanning speed when the stage is scanned in a direction away from said supply means.

14. The apparatus according to claim 11, wherein said supply means includes an air duct that surrounds the stage.

15. The apparatus according to claim 14, wherein said air duct has a smoothly and continuously changing cross sectional area.

16. The apparatus according to claim 14, wherein said air duct has such a shape that directions of the air streams are made substantially the same.

17. The apparatus according to claim 11, wherein said supply means produces air streams having a direction substantially parallel to a direction in which heat sources are arrayed.

18. The apparatus according to claim 17, wherein the direction in which the heat sources are arrayed is substantially parallel to the optical path of length measurement.

19. The apparatus according to claim 17, wherein the heat sources are linear motors for driving the stage.

20. A method of manufacturing a semiconductor device using a scanning-type exposure apparatus having reticle positioning means which includes a stage on which a reticle is placed, and substrate positioning means which includes a stage on which a substrate is placed, the substrate being exposed to a pattern on the reticle while the reticle and the substrate are scanned, comprising the steps of:

providing a reflecting mirror secured to at least one of the substrate stage and the reticle stage;

measuring a distance between a reference position and the reflecting mirror using light; and supplying temperature-regulated air streams to an optical path of length measurement connecting the reference position and the reflecting mirror, the air streams being supplied at a speed higher than a speed at which the stage is scanned during scanning exposure.

\* \* \* \* \*